(12) United States Patent
Huang et al.

(10) Patent No.: US 12,488,745 B2
(45) Date of Patent: Dec. 2, 2025

(54) DISPLAY PANEL AND DISPLAY DEVICE

(71) Applicant: Wuhan China Star Optoelectronics Technology Co., Ltd., Hubei (CN)

(72) Inventors: Can Huang, Hubei (CN); Rui He, Hubei (CN); Guowei Zha, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 18/038,729

(22) PCT Filed: Mar. 31, 2023

(86) PCT No.: PCT/CN2023/085770
§ 371 (c)(1),
(2) Date: May 25, 2023

(87) PCT Pub. No.: WO2024/197930
PCT Pub. Date: Oct. 3, 2024

(65) Prior Publication Data
US 2024/0363067 A1 Oct. 31, 2024

(30) Foreign Application Priority Data
Mar. 30, 2023 (CN) .......................... 202310350529.5

(51) Int. Cl.
*G09G 3/3233* (2016.01)
*H10D 86/40* (2025.01)
(Continued)

(52) U.S. Cl.
CPC ......... *G09G 3/3233* (2013.01); *H10D 86/441* (2025.01); *H10D 86/60* (2025.01);
(Continued)

(58) Field of Classification Search
CPC .................. G09G 3/32; G09G 3/3233; G09G 2300/0842; G09G 2360/14; H10D 86/441;
(Continued)

(56) References Cited

U.S. PATENT DOCUMENTS 9,041,697 B2    5/2015   Soto
10,714,554 B2   7/2020   Choo
(Continued)

FOREIGN PATENT DOCUMENTS

CN    1886012     12/2006
CN    102622970   8/2012
(Continued)

OTHER PUBLICATIONS

International Search Report and the Written Opinion Dated Dec. 21, 2023 From the International Searching Authority Re. Application No. PCT/CN2023/085770 and Its Translation Into English. (20 Pages).
(Continued)

*Primary Examiner* — Stacy Khoo

(57) ABSTRACT

A display panel and the display device are provided in the present disclosure. The display panel includes a photosensitive display circuit. The photosensitive display circuit includes a light-emitting diode, a pixel driving circuit, and a photosensitive circuit. By multiplexing the light-emitting diode, can not only achieve normal display function under the condition that the light-emitting diode is forward biased, but also achieve light detection according to the photo-generated current following through the light-emitting diode under the condition that the light-emitting diode is reverse biased or no biased. This alleviates the need for an additional light sensor, thereby reducing the cost and size of the display product.

20 Claims, 9 Drawing Sheets

(51) Int. Cl.
*H10D 86/60* (2025.01)
*G09G 3/32* (2016.01)
*H10K 59/131* (2023.01)

(52) U.S. Cl.
CPC ....... *G09G 3/32* (2013.01); *G09G 2300/0842* (2013.01); *G09G 2360/14* (2013.01); *H10K 59/131* (2023.02)

(58) Field of Classification Search
CPC ... H10D 86/60; H10F 39/8023; H10F 39/811; H10H 20/857; H10H 29/10; H10K 59/131
See application file for complete search history.

(56) References Cited

U.S. PATENT DOCUMENTS

| | | |
|---|---|---|
| 11,087,679 B2 | 8/2021 | Lim |
| 2006/0290616 A1 | 12/2006 | Murayama et al. |
| 2015/0348504 A1 | 12/2015 | Sakariya et al. |
| 2018/0348959 A1 | 12/2018 | Lin et al. |
| 2020/0258448 A1 | 8/2020 | Hargreaves |
| 2023/0132555 A1 | 5/2023 | Inoue |

FOREIGN PATENT DOCUMENTS

| | | |
|---|---|---|
| CN | 108109582 | 6/2018 |
| CN | 108766341 | 11/2018 |
| CN | 110941359 | 3/2020 |
| KR | 10-0740135 | 7/2007 |
| KR | 10-2017-0031862 | 3/2017 |
| WO | WO 2022/000434 | 1/2022 |

OTHER PUBLICATIONS

Notification of Office Action and Search Report Dated Jul. 16, 2025 From The State Intellectual Property Office of the People's Republic of China Re. Application No. 202310350529.5 and Its Translation Into English. (17 Pages).

DISPLAY PANEL AND DISPLAY DEVICE

RELATED APPLICATIONS

This application is a National Phase of PCT Patent Application No. PCT/CN2023/085770 having International filing date of Mar. 31, 2023, which claims the benefit of priority of Chinese Patent Application No. 202310350529.5 filed on Mar. 30, 2023. The contents of the above applications are all incorporated by reference as if fully set forth herein in their entirety.

FIELD AND BACKGROUND OF THE INVENTION

The present disclosure relates to a display panel manufacturing field, and more particularly, to a display panel and a display device.

In nowadays, the display panels of various electronic devices not only need better display characteristics, such as faster refresh rates, higher resolutions, and better color performance, but also better interactivity to attract more users. To increase interactivity with users, more technologies are integrated into display panels, such as touch control, camera, ambient light detection, fingerprint recognition, etc. However, these interactivity functions often require corresponding sensors.

However, these sensors still need to be integrated in the display panel, which increases the cost and size of the display panel.

SUMMARY OF THE INVENTION

Technical Problem

One objective of an embodiment of the present disclosure is to provide a display panel and a display device to alleviate the need of additional sensors.

Technical Solution

According to an embodiment of the present disclosure, a display panel is disclosed. The display panel comprises a photosensitive display circuit. The photosensitive display circuit comprises: a light-emitting diode, an cathode of the light-emitting diode is electrically connected to a first power line; a pixel driving circuit, electrically connected to a data line, a first scan line, a second power line, and an anode of the light-emitting diode; a row readout line, wherein one end of the row readout line is electrically connected to the anode of the light-emitting diode; and a row photosensitive data reader, electrically connected to another end of the row readout line to obtain a first photo-generated current flowing through the light-emitting diode.

In some embodiments, a plurality of the light-emitting diodes and a plurality of the pixel driving circuits are distributed in an array in the display panel. A plurality of the first power lines are arranged sequentially in a first direction in the display panel, and one of the first power lines is electrically connected to cathodes of a row of the light-emitting diodes. A plurality of the row readout lines are arranged sequentially in a second direction in the display panel, and one of the row readout lines is electrically connected to one of the row photosensitive data readers and anodes of a row of the light-emitting diodes.

In some embodiments, the photosensitive display circuit further comprises a column readout line and a column photosensitive data reader. One end of the column readout line is electrically connected to the cathode of the light-emitting diode. The column photosensitive data reader is electrically connected to another end of the column readout line to obtain a second photo-generated current flowing through the light-emitting diode.

In some embodiments, a plurality of the light-emitting diodes and a plurality of the pixel driving circuits are distributed in an array in the display panel. A plurality of the column readout lines are arranged sequentially in a first direction in the display panel, and one of the column readout lines is electrically connected to one of the column photosensitive data readers and cathodes of a column of the light-emitting diodes. A plurality of the row readout lines are arranged sequentially in a second direction in the display panel, and one of the row readout lines is electrically connected to one of the row photosensitive data readers and anodes of a row of the light-emitting diodes.

In some embodiments, the photosensitive display circuit further comprises a first transistor and a column photosensitive data reader. A first electrode of the first transistor is electrically connected to the cathode of the light-emitting diode, a gate of the first transistor is electrically connected to a second scan line, and a second electrode of the first transistor is electrically connected to the data line. The column photosensitive data reader is electrically connected to the data line to obtain a second photo-generated current flowing through the light-emitting diode.

In some embodiments, a plurality of the light-emitting diodes and a plurality of the pixel driving circuits are distributed in an array in the display panel. A plurality of the data lines are arranged sequentially in a first direction in the display panel, and one of the data lines is electrically connected to one of the column photosensitive data readers, the second electrodes of a column of the first transistors. A plurality of the row readout lines are arranged sequentially in a second direction in the display panel, and one of the row readout lines is electrically connected to one of the row photosensitive data readers and anodes of a row of light-emitting diodes.

In some embodiments, a frame of the photosensitive display circuit comprises a display phase and a blank phase. In the display phase the pixel driving circuit drives the light-emitting diode for display, and in the blank phase a photo-generated current flowing through the light-emitting diode is obtained.

In some embodiments, one frame of the photosensitive display circuit comprises a display phase and a blank phase. In the display phase, a voltage level of the anode of the light-emitting diode is greater than a voltage level of cathode of the light-emitting diode. In the blank phase, the voltage level of the anode of the light-emitting diode is less than or equal to the voltage level of the cathode of the light-emitting diode.

In some embodiments, one frame of the photosensitive display circuit comprises a display phase and a blank phase. In the display phase, the pixel driving circuit of the mth row is row-by-row scanned through the corresponding first scan line, and the first photo-generated current of the light-emitting diode in (m−k)th row is row-by-row obtained through the row photosensitive data reader, where m and k are both integers greater than or equal to 1, and k is less than m. In the blank phase, the first photo-generated current of the light-emitting diode in remaining rows is obtained row by row thorough the row photosensitive data reader.

According to an embodiment of the present disclosure, a display device is disclosed. The display device comprises the aforementioned display panel, and at least part of the photosensitive circuit is located in a non-display area of the display panel.

Advantageous Effect

The display panel and the display device in the present disclosure, by multiplexing the light-emitting diode, can not only achieve normal display function under the condition that the light-emitting diode is forward biased, but also achieve light detection (that determines the intensity and position of the light) according to the photo-generated current following through the light-emitting diode under the condition that the light-emitting diode is reverse biased or no biased. This alleviates the need for an additional light sensor, thereby reducing the cost and size of the display product.

DESCRIPTION OF SPECIFIC EMBODIMENTS OF THE INVENTION

The specific structural and functional details disclosed herein are representative only and are for the purpose of describing exemplary embodiments of the present application. However, the present application may be embodied in many alternative forms and should not be construed as being limited only to the embodiments set forth herein.

Figure 1:
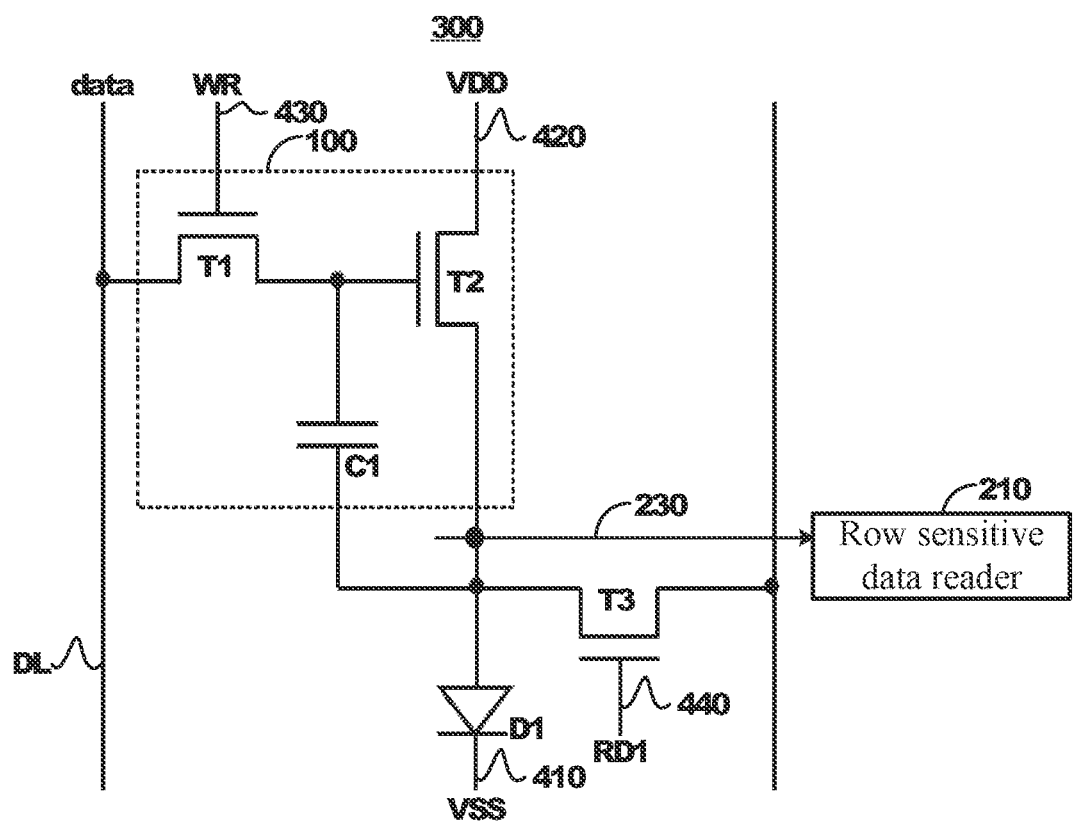
FIG. 1 is a circuit diagram of a photosensitive display circuit according to a first embodiment of the present disclosure.
Figure 2:
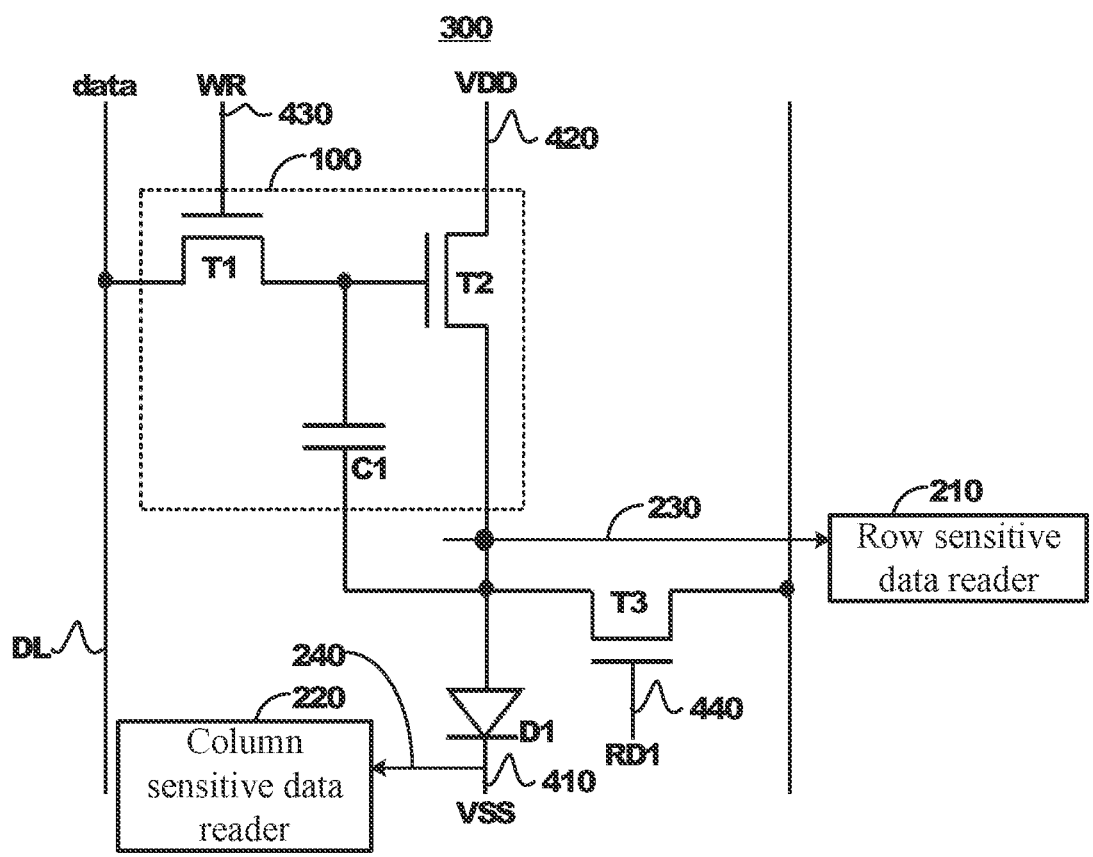
FIG. 2 is a circuit diagram of a photosensitive display circuit according to a second embodiment of the present disclosure.
Figure 3:
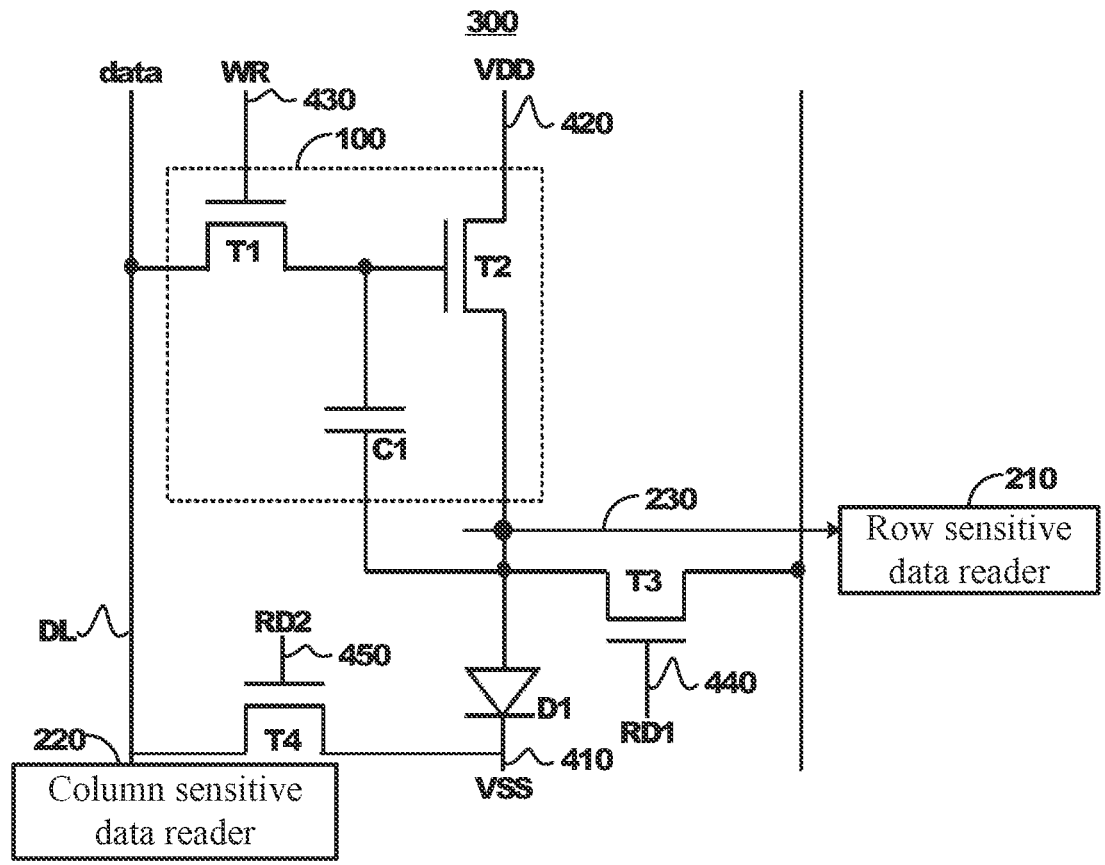
FIG. 3 is a circuit diagram of a photosensitive display circuit according to a third embodiment of the present disclosure.

According to an embodiment of the present disclosure, a display panel is disclosed. As shown in FIGS. 1-3, the display panel comprises a photosensitive display circuit 300. The photosensitive display circuit 300 comprises at last one of a light-emitting diode D1, a pixel driving circuit 100, a row readout line 230 and a row sensitive data reader 210. The cathode of the light-emitting diode D1 is electrically connected to the first power line 410. The pixel driving circuit 100 is electrically connected to the data line DL, the first scan line 430, the second power line 420 and the anode of the light-emitting diode D1. One end of the row readout line 230 is electrically connected to the anode of the light-emitting diode D1. The row photosensitive data reader 210 is electrically connected to the other end of the row readout line 230 to obtain a first photo-generated current flowing through the light-emitting diode D1.

In this embodiment, the display panel, through using the pixel driving circuit 100 and the photosensitive circuit 200 to multiplex the light-emitting diode D1, can not only achieve normal display function under the condition that the light-emitting diode D1 is forward biased, but also achieve light detection (that determines the intensity and position of the light) according to the photo-generated current following through the light-emitting diode D1 under the condition that the light-emitting diode D1 is reverse biased or no biased. This alleviates the need for an additional light sensor, thereby reducing the cost and size of the display product.

In this embodiment, when the voltage level of the anode of the light-emitting diode D1 is controlled by the first power line 410 to be lower than or equal to the voltage level of the cathode of the light-emitting diode D1, the first photo-generated current flows from the anode of the light-emitting diode D1 to the row photosensitive data reader 210. The row photosensitive data reader 210 may determine light intensity upon the display panel according to the magnitude of the first photo-generated current.

The LED D1 can be a mini light-emitting diode, a micro-light-emitting diode, an organic light-emitting diode or a quantum dot light-emitting diode. Please refer to FIGS. 4-6, the LED D1 can be represented by a P-region D11, a PN junction D12 and an N-region D13 of the light-emitting diode D1.

Figure 4:
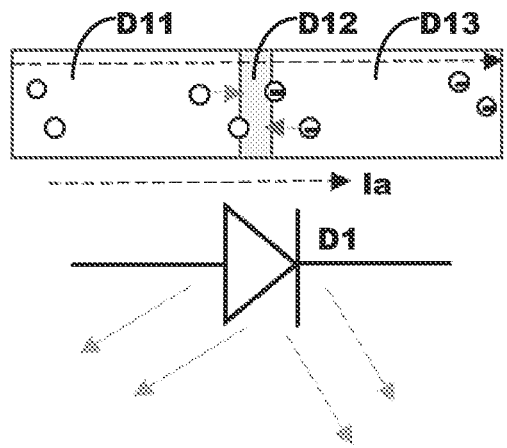
FIG. 4 is a diagram showing a current of the light-emitting diode when the LED is forward biased according to an embodiment of the present disclosure.
Figure 5:
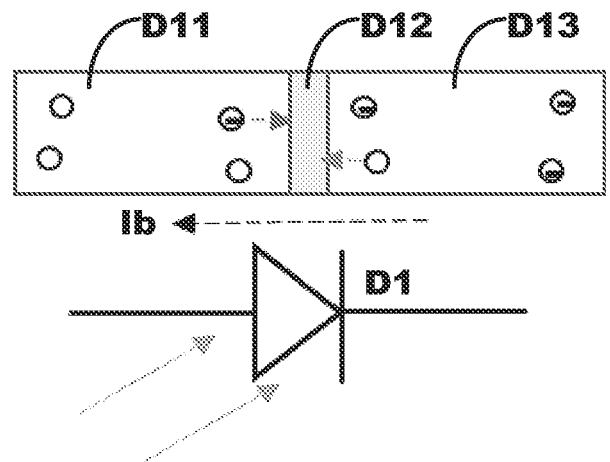
FIG. 5 is a diagram showing a current of the light-emitting diode when the LED is not biased according to an embodiment of the present disclosure.
Figure 6:
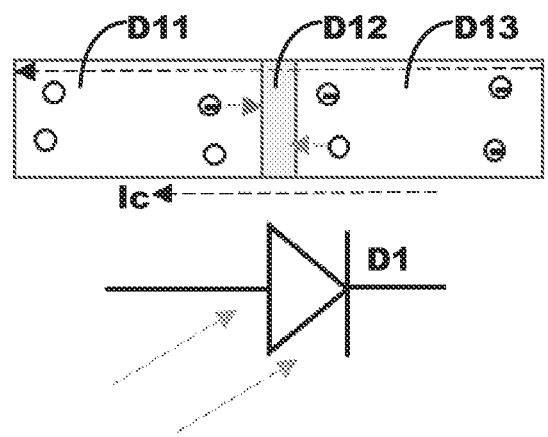
FIG. 6 is a diagram showing a current of the light-emitting diode when the LED is reverse biased according to an embodiment of the present disclosure.

As shown in FIG. 4, the LED D1 generates a forward current when a forward bias is applied to the LED D1 based on the nature of its PN junction D12, i.e. the hole injected from the P-region D11 to the N-region D13 and the electrons injected from the N-region D13 into P-region D11 are recombined at the PN junction D12 to produce radiation fluorescence, which can be used for display. At the same time, the PN junction D12 also has good photosensitive characteristics. When light is applied to the PN junction D12, free electrons and holes can be generated, so that the concentration of minority carriers in semiconductors is increased. As shown in FIG. 5 and FIG. 6, when the LED D1 is no biased (FIG. 5) or reverse biased (FIG. 6), the reverse current (Ib/Ic) linearly increases as the applied light intensity increases.

The pixel driving circuit 100 can be a 2T1C (two transistors and one capacitor), a 3T1C (three transistors and one capacitor), a 7T1C (seven transistors and one capacitor), a 7T2C (seven transistors and two capacitors), a 8T1C (eight transistors and one capacitor), a 9T2C (nine transistors and two capacitors) or other structures, but these structures are not regarded as a limitation of the present disclosure. The pixel driving circuit 100 can have another structure. Taking 2T1C as an example, the pixel driving circuit 100 may include a write-in transistor T1, a driving transistor T2 and a storage capacitor C1. The first electrode of the write-in transistor T1 is electrically connected to the data line DL, and the second electrode of the write-in transistor T1 is electrically connected to the gate of the driving transistor T2. The gate of the write-in transistor T1 is electrically connected to the first scan line 430. The first electrode of the driving transistor T2 is electrically connected to the second power line 420, and the second electrode of the driving transistor T2 is electrically connected to the anode of the light-emitting diode D1. One end of the storage capacitor C1 is electrically connected to the gate of the driving transistor T2, and the other end of the storage capacitor C1 can be electrically connected to the second electrode of the driving transistor T2, the first power line 410 or the second power line 420.

The first electrode can be one of the drain and the source, and the second electrode can be the other of the drain and the source. For example, when the first electrode is the drain, the second electrode is the source. Alternatively, when the first electrode is the source, the second electrode is the drain.

The data line DL is used to transmit the corresponding data signal data. The first scan line 430 is used to transmit the first scan signal WR. The first power line 410 is used to transmit the negative power signal VSS, and the second power line 420 is used to transmit the positive power signal VDD.

In one embodiment, the pixel driving circuit 100 may further include a sensing transistor T3. The first electrode of the sensing transistor T3 is electrically connected to the anode of the light-emitting diode D1. The gate of the sensing transistor T3 is electrically connected to the third scan line 440, and the second electrode of the sensing transistor T3 is electrically connected to the sensing line.

The third scan line 440 is used to transmit a second scan signal RD1. In this embodiment, the sensing transistor T3 could be controlled by the third scan line 440 to be turned on such that the voltage level of the source of the driving transistor T2 or the voltage level of the reset driving transistor T2 could be obtained.

Figure 7:
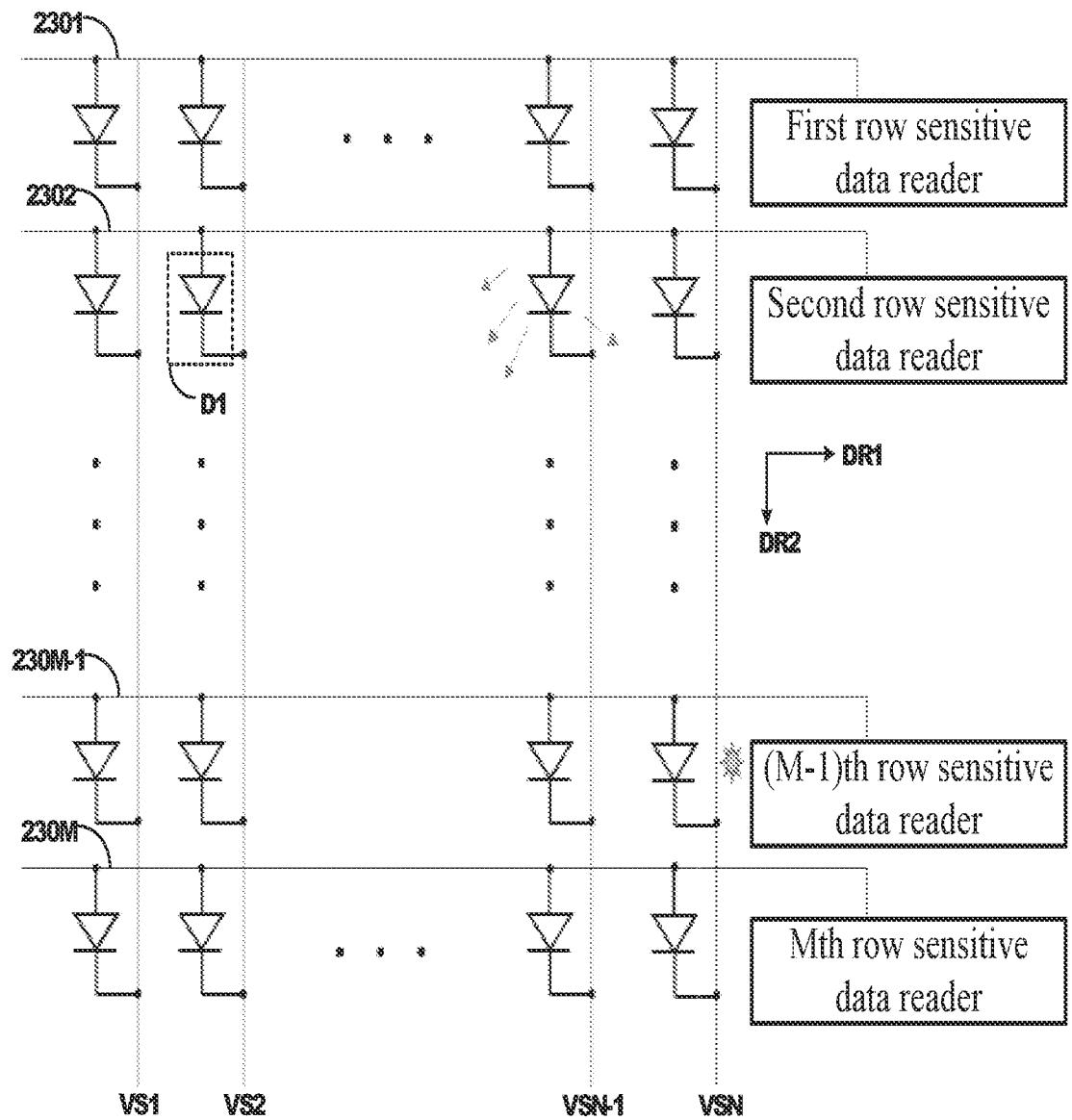
FIG. 7 is a diagram of the photosensitive display circuit shown in FIG. 1 in the display panel.

As shown in FIGS. 2 and 7, a plurality of light-emitting diodes D1 and a plurality of pixel driving circuits 100 are distributed in an array in the display panel. A plurality of first power lines 410 are arranged sequentially in the display panel along the first direction DR1 and are electrically connected to a first power line 410 and the cathodes of a column of light-emitting diodes D1. A plurality of row readout lines 230 are arranged sequentially in the display panel in the second direction DR2 and are electrically connected to a row of readout lines 230 and a row of photosensitive data readers 210, the anodes of a row of the light-emitting diodes D1.

The first direction DR1 can be the arrangement direction of a plurality of data lines DL, and the second direction DR2 can be the extension direction of data lines DL. Alternatively, the first direction DR1 and the second direction DR2 could cross or could be perpendicular to each other.

As shown in FIGS. 2 and 7, the display panel has a photosensitive display circuit 300 having M rows and N columns as an example. A plurality of row readout lines 230 may comprise a first row readout line 2301, a second row readout line 2302 . . . a $(M-1)^{th}$ row readout line is 230M-1, and an $M^{th}$ row readout line is 230M. The row sensitive data reader 210 may have M row sensitive data readers, such as a first row of photosensitive data reader, a second row of photosensitive data reader . . . a $(M-1)^{th}$ row data reader, an $M^{th}$ row data reader.

The first row readout line 2301 is electrically connected to the anodes of all LEDs D1 in the first row of the display panel and the first row of the photosensitive data readers. The second row readout line 2302 is electrically connected to the anodes of all LEDs D1 in the second row of the display panel and the second row photosensitive data reader. The $(M-1)^{th}$ row readout line 230M-1 is electrically connected to the anodes of all the LEDs in the $(M-1)^{th}$ row in the display panel and the $(M-1)^{th}$ row photosensitive data reader. The $M^{th}$ row readout line 230M is electrically connected to anodes of all the LEDs in the $M^{th}$ row in the display panel and the $M^{th}$ row photosensitive data reader.

The plurality of first power lines 410 may include a first power line VS1, a first power line VS2 . . . a first power line VSN-1, and a first power line VSN. The first power line VS1 is electrically connected to the cathodes of all LEDs D1 in the first column in the display panel. The first power line VS2 is electrically connected to the cathodes of all LEDs D1 in the second column in the display panel . . . . The first power line VSN-1 is electrically connected to the cathodes of all LEDs D1 in the $(N-1)^{th}$ column in the display panel. The first power line VSN is electrically connected to the cathodes of all LEDs D1 in the $N^{th}$ column in the display panel.

In the process of light detection, the voltage level of the first power line 410 is increased and/or the voltage level of the row readout line 230 is decreased one by one, so that the voltage level of the anode of the light-emitting diode D1 is lower than or equal to the voltage level of the cathode of the light-emitting diode D1. At this time, the light intensity received by the display panel can be determined according to the detected photo-generated current flowing through the light-emitting diode D1. In addition, according to the number of columns of light detection (or the application of the high voltage level to the corresponding first power line 410) and the corresponding line photosensitive data reader 210 that obtains the photo-generated current, the light position can be determined. For example, when the light detection is performed on the light-emitting diode D1 in the first column, if the photosensitive data reader in the first row obtains the corresponding photo-generated current, then it is determined that the LED D1 at the first row and the first column is lightened so that the light position can be determined.

Figure 8:
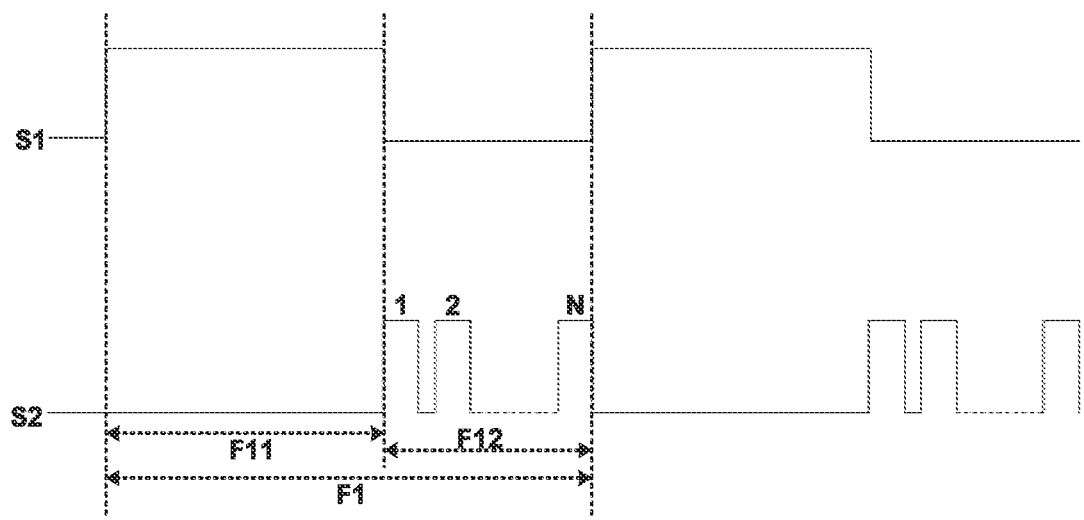
FIG. 8 is a timing diagram of the display panel shown in FIG. 7.

As shown in FIG. 8, a frame F1 of the photosensitive display circuit 300 comprises a display phase F11 and a blank phase F12. In the display phase F11, the driving circuit in the pixel area drives the light-emitting diode D1. For example, the driving circuit could control the voltage level of the anode of the LED D1 to be greater than the voltage level of the cathode of the LED D1 such that the light-emitting current flows through the light-emitting diode D1 for display. In the blank phase F12, the voltage level of the anode of the LED D1 is less than or equal to the voltage level of the cathode of the LED D1 such that the photo-generated current flowing through LED D1 can be obtained for light detection.

In the blank stage F12, the light detection could be column-by-column performed on the LEDs D1 of the $N^{th}$ column. Specifically, the high voltage level of the display enable signal S1 can control the display panel to work in the display phase F11, and the low voltage level of the display enable signal S1 can control the display panel to work in the blank stage F12 such that each pulse of the light detection enable signal S2 can control a column of LEDs D1 for light detection.

Figure 9:
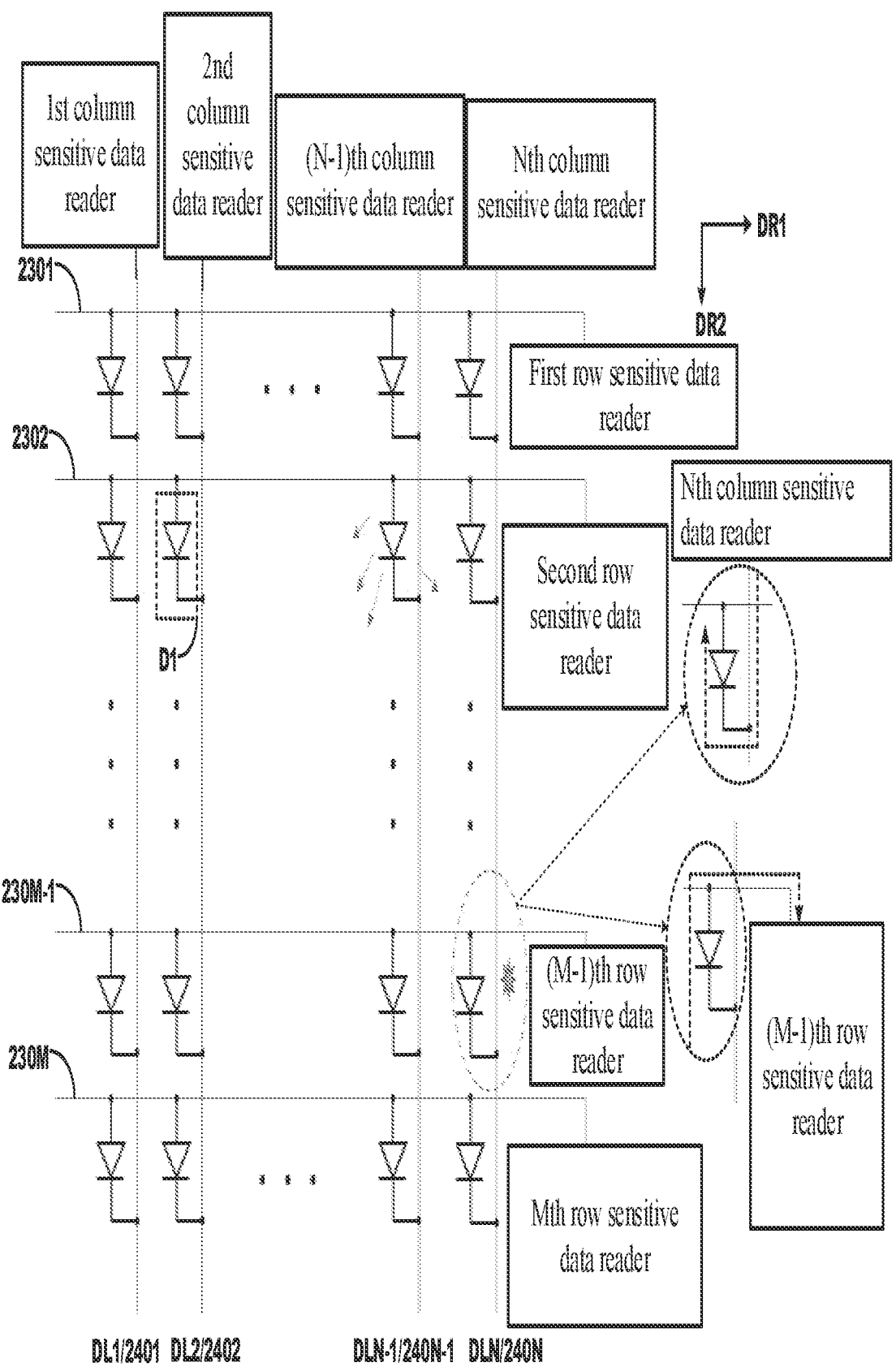
FIG. 9 is a diagram of the photosensitive display circuit shown in FIG. 2 and FIG. 3 in the display panel.

As shown in FIGS. 2 and 9, the photosensitive circuit 200 further comprises a column readout line 240 and a column photosensitive data reader 220. One end of the column readout line 240 is electrically connected to the cathode of the light-emitting diode D1. The other end of the column readout line 240 is electrically connected to the column photosensitive data reader 220 to obtain a second photo-generated current flowing through the light-emitting diode D1.

The column photosensitive data reader 220 may obtain a photo-generated current flowing through the light-emitting diode D1 when the voltage level of the cathode of the light-emitting diode D1 is higher than or equal to the voltage level of the anode of the light-emitting diode D1.

As shown in FIGS. 2 and 9, a plurality of light-emitting diodes D1 and a plurality of pixel driving circuits 100 are arranged in an array in the display panel. A plurality of column readout lines 240 are arranged sequentially in the first direction DR1 in the display panel. One column readout line 240 is electrically connected to one column photosensitive data reader 220 and cathodes of a column of light-emitting diode D1. A plurality of row readout line 230 are arranged sequentially in the display panel in the second direction DR2. One row readout line 230 is electrically connected to one row photosensitive data readout 210 and anodes of a row of light-emitting diodes D1.

The column readout line 240 may comprise a first column readout line 2401, a second column readout line 2402 . . . a $(N-1)^{th}$ column readout line 240N-1, and an $N^{th}$ column readout line 240N. Here, the first column readout line 2401 is electrically connected to the cathodes of the light-emitting diodes D1 in the first column of the display panel and the first column photosensitive data reader. The second column readout line 2402 is electrically connected to the cathodes of the light-emitting diodes D1 in the second column of the display panel and the second column photosensitive data reader. The column readout line 240N-1 is electrically connected to the cathodes of the light-emitting diodes D1 in the $(N-1)^{th}$ column of the display panel and the $(N-1)^{th}$ column photosensitive data reader. The column readout line 240N is electrically connected is electrically connected to the cathodes of the light-emitting diodes D1 in the $N^{th}$ column of the display panel and the $N^{th}$ column photosensitive data reader.

In addition, in this embodiment, the photo-generated current is detected by using the column readout line 240 and the column photosensitive data reader 220. In the process of row scan or column scan, a single column readout line and/or the sensing transistor T3 could be used to apply a zero bias or a reverse bias on the light-emitting diode D1. This reduces the influence from the display signal and further improves the sensitivity of light detection.

As shown in FIGS. 3 and 9, the photosensitive circuit 200 further comprises a first transistor T4 and a column photosensitive data reader 220. The first electrode of the first transistor T4 is electrically connected to the cathode of the light-emitting diode D1. The gate of the first transistor T4 is electrically connected to the second scan line 450. The second electrode of the first transistor T4 is electrically connected to the data line DL. The column photosensitive data reader 220 is electrically connected to the data line DL to obtain the second photo-generated current flowing through the light-emitting diode D1.

In this embodiment, a data line DL is used instead of the column readout line 240 of the previous embodiment. This saves the required column readout line 240 and thus reduces the size of the display area in the display panel.

In the process of light detection, because it is performed in the blank phase F12, the data line DL is idle at this time. Thus, the first transistor T4 can be turned on for the light detection, and then the column scan could be performed to achieve the light detection.

The second scan line 450 is used to transmit a third scan signal RD2.

As shown in FIGS. 3 and 9, a plurality of light-emitting diodes D1 and a plurality of pixel driving circuits 100 are distributed in an array in the display panel. A plurality of data lines DL are arranged in the display panel in the first direction DR1. One data line DL is electrically connected to a column photosensitive data reader 220 and the second electrodes of the first transistors T4 of a column. A plurality of row reader lines 230 are arranged sequentially in the display panel in the second direction DR2, One row readout line 230 is electrically connected to a row photosensitive data reader 210 and the anodes of the light-emitting diode D1 of a row.

The plurality of data lines DL can comprise the first data line DL1, the second data line DL2 . . . the $(N-1)^{th}$ data line DLN-1, the $N^{th}$ data line DLN. Among them, the first data line DL1 is electrically connected to the second electrodes of the first transistors T4 in the first column of the display panel and the first row photosensitive data reader. The second data line DL2 is electrically connected to the second electrodes of the first transistors T4 in the second column of the display panel and the second row photosensitive data reader. The $(N-1)^{th}$ data line DLN-1 is electrically connected to the second electrodes of the first transistors T4 in the $(N-1)^{th}$ column of the display panel and the $(N-1)^{th}$ row photosensitive data reader. The $N^{th}$ data line DLN is electrically connected to the second electrodes of the first transistors T4 in the $N^{th}$ column of the display panel and the $N^{th}$ row photosensitive data reader.

In the process of performing column scanning in the light detection, a high voltage level is inputted to N column readout lines or data lines DL, so that the voltage level of the cathode of the light-emitting diode D1 is higher than or equal to the voltage level of the anode of the light-emitting diode D1. At this time, the reverse current or photo-generated current is obtained by the corresponding row photosensitive data reader 210 corresponding to each row, thereby determining the row positioning of the light. In the process of performing row scanning in the light detection, the light-emitting diode D1 can be unbiased (that is, the bias voltage is zero), the photo-generated current still flows from the N-region D13 to the P-region D11. At this time, the reverse current or the photo-generated current generated by the external light may be obtained by the corresponding column photosensitive data reader 220 of each column, thereby determining the column position of the light. Then, based on the row position and the column position, the position of the light can be accurately determined. According to the amplitude of the detected photo-generated current, the light intensity can be obtained.

Figure 10:
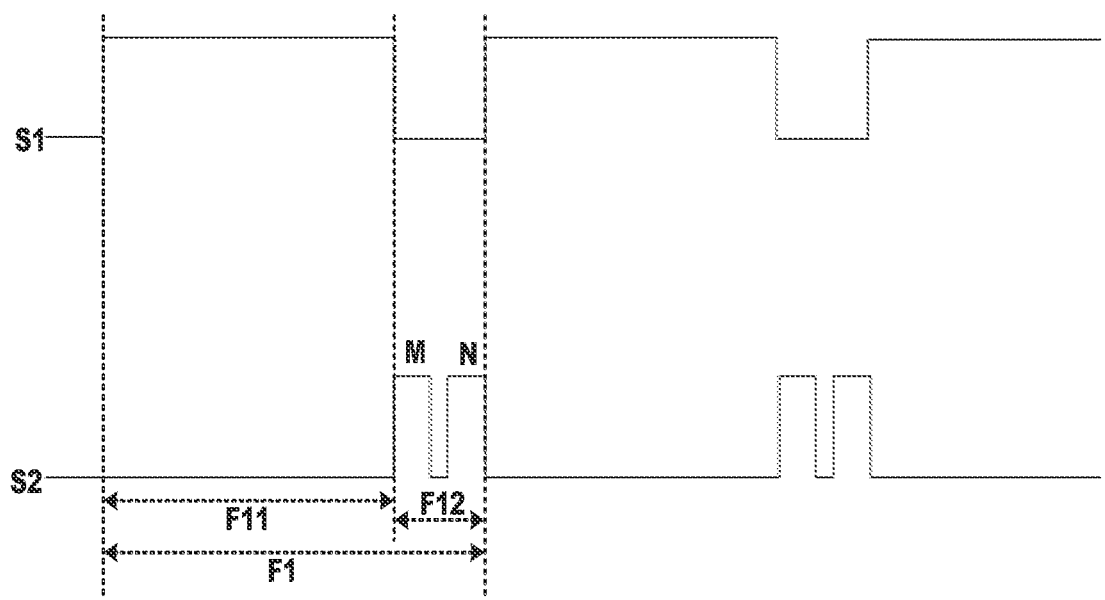
FIG. 10 is a timing diagram of the display panel shown in FIG. 9.

As shown in FIG. 10, in the process of light detection, since each row of light-emitting diodes D1 has a corresponding row photosensitive data reader 210, each column of light-emitting diodes D1 has a corresponding column photosensitive data reader 220, the LEDs D1 of an M*N array (M rows and N columns) can be scanned at the same time. Compared to the timing shown in FIG. 8, the light detection enable signal S2 shown in FIG. 10 requires only two pulses in a blank phase F12 to complete the light detection. One of the pulses can simultaneously detect LEDs D1 of M rows, and the other pulse can simultaneously detect LEDs D1 in N columns. Accordingly, the intensity and position of the light can then be determined based on the light detection process detailed above. It can be seen that compared to FIG. 8 where the light detection N times could be performed for N times in a blank stage F12, the light detection shown in FIG. 10 could greatly reduce the time of light detection and is also beneficial for higher resolution display panels.

Figure 11:
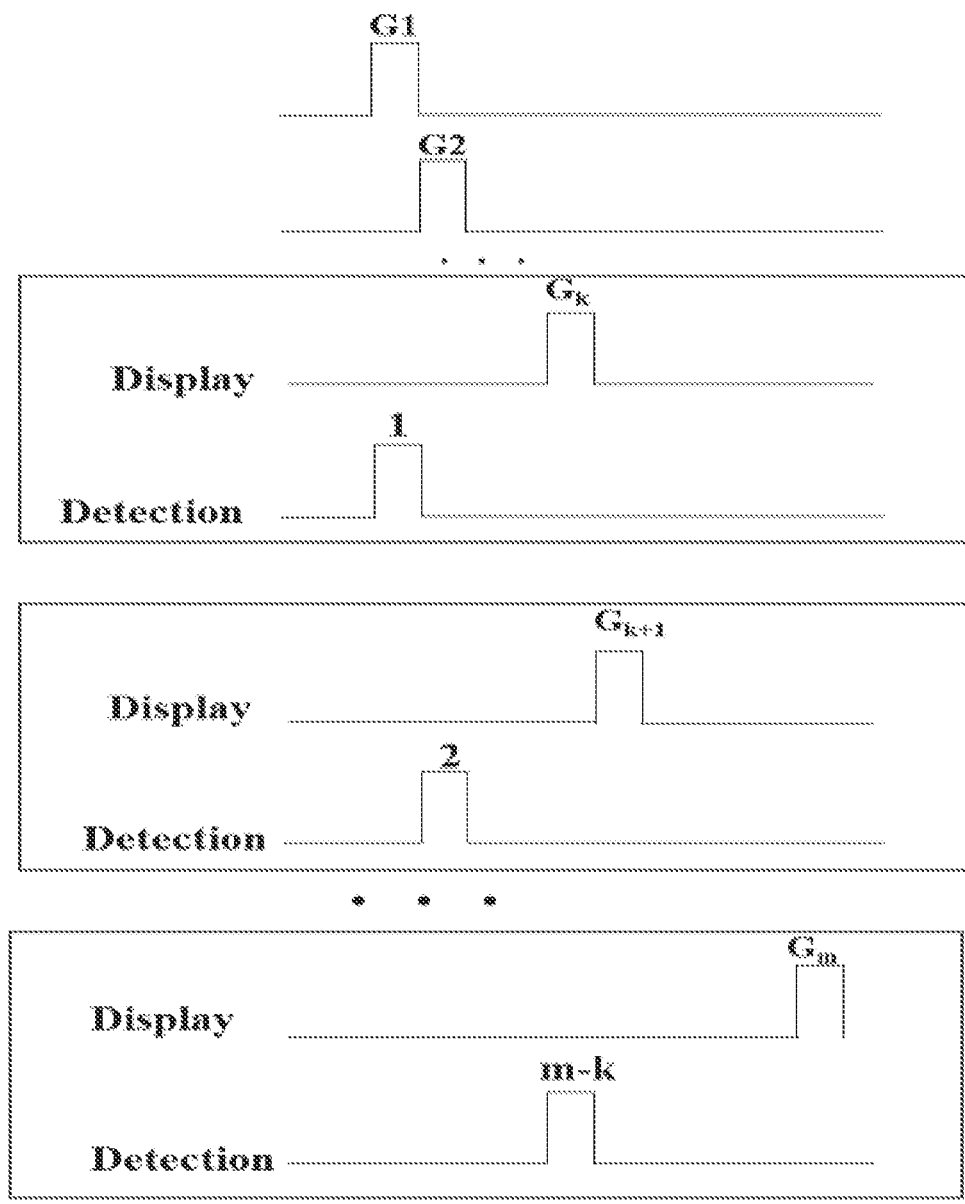
FIG. 11 is another timing diagram of the display panel shown in FIG. 7.

As shown in FIG. 11, the display panel comprises a plurality of first scan lines 430. These first scan lines 430 receive the scan signals G1, G2 . . . $G_k$, $G_{k+1}$ . . . Gm to progressively scan the pixel driving circuit 100 in each of the rows through the corresponding first scan lines 430 in the display timing of the display phase. Furthermore, in each pulse (1, 2 . . . m−k), the row photosensitive data readers 210 are used to row by row obtain the first photo-generated current of LEDs D1 in each row. And then, in the blank phase, the first photo-generated current of the light-emitting diodes D1 in the remaining rows are obtained row by row by the row photosensitive data readers 210.

For example, the panel can simultaneously implement the function of display and light detection. Therefore, for the light-emitting diodes D1 or the pixel driving circuits 100 of m rows, in the process of row-by-row scan, when the light-emitting diodes D1 in the k$^{th}$ row (corresponding to the pulse of the scan signal G$_k$) emits light in the display state, the LEDs D1 in the first row could be read synchronously (corresponding to pulse 1 in the light detection) for light detection. When the LEDs D1 in (k+1)$^{th}$ row (corresponding to the pulse of the scan signal G$_{k+1}$) emits light in the display state, the LEDs D1 in the second row could be read synchronously (corresponding to pulse 2 in the light detection) for light detection. This process continues until the light-emitting diode D1 in the m$^{th}$ row (corresponding to the pulse of the scan signal G$_m$) is in the display state and the LEDs D1 in the (m−k)$^{th}$ row are read synchronously (corresponding to pulse m−k in the light detection) for light detection. At this point, the display scan of the current frame is finished. However, at this time, only the photosensitive reading of the LEDs D1 in a part of rows is completed, so the photosensitive reading of LEDs D1 in the remaining rows can be performed in the blank phase (V-Blanking).

Simultaneous display scanning and photosensitive reading of different rows can significantly reduce reading time. In one frame, the sensor reads the LED array that has been displayed.

Here, m and k are integers greater than or equal to 1, and k is less than m. Specifically, k may also be 3, 4, 5, etc. Preferably, k is 3. In this way, as many LED arrays as possible can be read during the display phase, this could better avoid influencing the display process.

In one embodiment, a display device is disclosed. The display device comprises a display panel of at least one of the above-mentioned embodiment. At least part of the photosensitive circuit 200 is located in the non-display area of the display panel.

The display panel and the display device in the present disclosure, by multiplexing the light-emitting diode, can not only achieve normal display function under the condition that the light-emitting diode is forward biased, but also achieve light detection (that determines the intensity and position of the light) according to the photo-generated current following through the light-emitting diode under the condition that the light-emitting diode is reverse biased or no biased. This alleviates the need for an additional light sensor, thereby reducing the cost and size of the display product.

Since at least a part of the photosensitive circuit 200, for example, at least one of the column of the photosensitive data readers 220 and/or one of the row photosensitive data readers 210 may be constructed in the non-display area of the display panel, this may reduce its occupied display area in the display panel and maximize the area of the display area.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A display panel, comprising a photosensitive display circuit, the photosensitive display circuit comprising:
   a light-emitting diode, having a cathode electrically connected to a first power line;
   a pixel driving circuit, electrically connected to a data line, a first scan line, a second power line, and an anode of the light-emitting diode; wherein the pixel driving circuit comprises a sensing transistor comprising:
      a first electrode, wherein the first electrode and the anode of the light-emitting diode are directly electrically connected to a first node; and
      a second electrode electrically connected to a sensing line;
   a row readout line, wherein one end of the row readout line and the anode of the light-emitting diode are electrically connected to a second node between the first node and the pixel driving circuit, and the first node and the second node are arranged at a same line connecting the pixel driving circuit and the anode of the light-emitting diode; the one end of the row readout line is directly coupled with the second node; and
   a row photosensitive data reader, electrically connected to another end of the row readout line to obtain a first photo-generated current flowing through the light-emitting diode.

2. The display panel of claim 1, wherein a plurality of the light-emitting diodes and a plurality of the pixel driving circuits are distributed in an array in the display panel;
   wherein a plurality of the first power lines are arranged sequentially in a first direction in the display panel, and one of the first power lines is electrically connected to cathodes of a row of the light-emitting diodes; and
   wherein a plurality of row readout lines are arranged sequentially in a second direction in the display panel, and one of the row readout lines is electrically connected to one of a plurality of row photosensitive data readers and anodes of a row of the light-emitting diodes.

3. The display panel of claim 1, wherein the photosensitive display circuit further comprises:
   a column readout line, one end of the column readout line is electrically connected to the cathode of the light-emitting diode; and
   a column photosensitive data reader, electrically connected to another end of the column readout line to obtain a second photo-generated current flowing through the light-emitting diode.

4. The display panel of claim 3, wherein a plurality of the light-emitting diodes and a plurality of the pixel driving circuits are distributed in an array in the display panel;
   wherein a plurality of the column readout lines are arranged sequentially in a first direction in the display panel, and one of the column readout lines is electrically connected to one of a plurality of column photosensitive data readers and cathodes of a column of the light-emitting diodes; and
   wherein a plurality of row readout lines are arranged sequentially in a second direction in the display panel, and one of the row readout lines is electrically connected to one of a plurality of row photosensitive data readers and anodes of a row of the light-emitting diodes.

5. The display panel of claim 1, wherein the photosensitive display circuit further comprises:
   a first transistor, wherein a first electrode of the first transistor is electrically connected to the cathode of the light-emitting diode, a gate of the first transistor is electrically connected to a second scan line, and a second electrode of the first transistor is electrically connected to the data line; and a column photosensitive data reader, electrically connected to the data line to obtain a second photo-generated current flowing through the light-emitting diode.

6. The display panel of claim 5, wherein a plurality of the light-emitting diodes and a plurality of the pixel driving circuits are distributed in an array in the display panel;

wherein a plurality of data lines are arranged sequentially in a first direction in the display panel, and one of the data lines is electrically connected to one of a plurality of column photosensitive data readers, and second electrodes of a column of first transistors; and wherein a plurality of row readout lines are arranged sequentially in a second direction in the display panel, and one of the row readout lines is electrically connected to one of a plurality of row photosensitive data readers and anodes of a row of light-emitting diodes.

7. The display panel of claim 1, wherein a frame of the photosensitive display circuit comprises a display phase and a blank phase, in the display phase the pixel driving circuit drives the light-emitting diode for display, and in the blank phase a photo-generated current flowing through the light-emitting diode is obtained.

8. The display panel of claim 1, wherein one frame of the photosensitive display circuit comprises a display phase and a blank phase; in the display phase, a voltage level of the anode of the light-emitting diode is greater than a voltage level of cathode of the light-emitting diode; in the blank phase, the voltage level of the anode of the light-emitting diode is less than or equal to the voltage level of the cathode of the light-emitting diode.

9. The display panel of claim 1, wherein one frame of the photosensitive display circuit comprises a display phase and a blank phase;

in the display phase, the pixel driving circuit of the mth row is row-by-row scanned through the corresponding first scan line, and the first photo-generated current of the light-emitting diode in (m−k)th row is row-by-row obtained through the row photosensitive data reader, wherein m and k are both integers greater than or equal to 1, and k is less than m; and in the blank phase, the first photo-generated current of the light-emitting diode in remaining rows is obtained row by row thorough the row photosensitive data reader.

10. A display device, comprising a display panel, the display panel comprising a photosensitive display circuit, the photosensitive display circuit comprising:

a light-emitting diode, having a cathode electrically connected to a first power line;

a pixel driving circuit, electrically connected to a data line, a first scan line, a second power line, and an anode of the light-emitting diode; wherein the pixel driving circuit comprises a sensing transistor comprising:

a first electrode, wherein the first electrode and the anode of the light-emitting diode are directly electrically connected to a first node; and a second electrode electrically connected to a sensing line;

a row readout line, wherein one end of the row readout line and the anode of the light-emitting diode are electrically connected to a second node between the first node and the pixel driving circuit, and the first node and the second node are arranged at a same line connecting the pixel driving circuit and the anode of the light-emitting diode; the one end of the row readout line is directly coupled with the second node; and a row photosensitive data reader, electrically connected to another end of the row readout line to obtain a first photo-generated current flowing through the light-emitting diode;

wherein at least part of a photosensitive circuit is located in a non-display area of the display panel.

11. The display panel of claim 10, wherein a plurality of the light-emitting diodes and a plurality of the pixel driving circuits are distributed in an array in the display panel;

wherein a plurality of the first power lines are arranged sequentially in a first direction in the display panel, and one of the first power lines is electrically connected to cathodes of a row of the light-emitting diodes; and wherein a plurality of row readout lines are arranged sequentially in a second direction in the display panel, and one of the row readout lines is electrically connected to one of a plurality of row photosensitive data readers and anodes of a row of the light-emitting diodes.

12. The display device of claim 10, wherein the photosensitive display circuit further comprises:

a column readout line, one end of the column readout line is electrically connected to the cathode of the light-emitting diode; and a column photosensitive data reader, electrically connected to another end of the column readout line to obtain a second photo-generated current flowing through the light-emitting diode.

13. The display device of claim 12, wherein a plurality of the light-emitting diodes and a plurality of the pixel driving circuits are distributed in an array in the display panel;

wherein a plurality of the column readout lines are arranged sequentially in a first direction in the display panel, and one of the column readout lines is electrically connected to one of a plurality of column photosensitive data readers and cathodes of a column of the light-emitting diodes; and wherein a plurality of row readout lines are arranged sequentially in a second direction in the display panel, and one of the row readout lines is electrically connected to one of a plurality of row photosensitive data readers and anodes of a row of the light-emitting diodes.

14. The display device of claim 10, wherein the photosensitive display circuit further comprises:

a first transistor, wherein a first electrode of the first transistor is electrically connected to the cathode of the light-emitting diode, a gate of the first transistor is electrically connected to a second scan line, and a second electrode of the first transistor is electrically connected to the data line; and a column photosensitive data reader, electrically connected to the data line to obtain a second photo-generated current flowing through the light-emitting diode.

15. The display device of claim 14, wherein a plurality of the light-emitting diodes and a plurality of the pixel driving circuits are distributed in an array in the display panel;

wherein a plurality of data lines are arranged sequentially in a first direction in the display panel, and one of the data lines is electrically connected to one of a plurality of column photosensitive data readers, and second electrodes of a column of first transistors; and wherein a plurality of row readout lines are arranged sequentially in a second direction in the display panel, and one of the row readout lines is electrically connected to one of a plurality of row photosensitive data readers and anodes of a row of light-emitting diodes.

16. The display device of claim 10, wherein a frame of the photosensitive display circuit comprises a display phase and a blank phase, in the display phase the pixel driving circuit drives the light-emitting diode for display, and in the blank phase a photo-generated current flowing through the light-emitting diode is obtained.

17. The display device of claim 10, wherein one frame of the photosensitive display circuit comprises a display phase and a blank phase; in the display phase, a voltage level of the anode of the light-emitting diode is greater than a voltage level of cathode of the light-emitting diode; in the blank phase, the voltage level of the anode of the light-emitting diode is less than or equal to the voltage level of the cathode of the light-emitting diode.

18. The display device of claim 10, wherein one frame of the photosensitive display circuit comprises a display phase and a blank phase;

in the display phase, the pixel driving circuit of the mth row is row-by-row scanned through the corresponding first scan line, and the first photo-generated current of the light-emitting diode in (m−k)th row is row-by-row obtained through the row photosensitive data reader, wherein m and k are both integers greater than or equal to 1, and k is less than m; and in the blank phase, the first photo-generated current of the light-emitting diode in remaining rows is obtained row by row thorough the row photosensitive data reader.

19. The display device of claim 10, wherein the light-emitting diode is a mini light-emitting diode, a micro-light-emitting diode, an organic light-emitting diode or a quantum dot light-emitting diode.

20. The display device of claim 10, wherein the pixel driving circuit comprises:

a write-in transistor, wherein a first electrode of the write-in transistor is electrically connected to the data line, and a gate of the write-in transistor is electrically connected to the first scan line;

a driving transistor, wherein a first electrode of the driving transistor is electrically connected to the second power line, and a second electrode of the driving transistor is electrically connected to the anode of the light-emitting diode, and a gate of the driving transistor is electrically connected to a second electrode of the write-in transistor; and a storage capacitor, electrically connected between the gate of the driving transistor and a node which is connected to the second electrode of the driving transistor, the first power line or the second power line.

* * * * *